(12) United States Patent
Kim et al.

(10) Patent No.: US 11,718,786 B2
(45) Date of Patent: *Aug. 8, 2023

(54) QUANTUM DOTS AND QUANTUM DOT SOLUTIONS

(71) Applicant: SAMSUNG ELECTRONICS CO., LTD., Suwon-si (KR)

(72) Inventors: Tae Hyung Kim, Seoul (KR); Kwanghee Kim, Seoul (KR); Eun Joo Jang, Suwon-si (KR); Dae Young Chung, Suwon-si (KR); Sujin Park, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/675,459

(22) Filed: Feb. 18, 2022

(65) Prior Publication Data

US 2022/0169921 A1    Jun. 2, 2022

Related U.S. Application Data

(63) Continuation of application No. 16/791,327, filed on Feb. 14, 2020, now Pat. No. 11,254,863.

(30) Foreign Application Priority Data

Feb. 15, 2019 (KR) .................. 10-2019-0018227

(51) Int. Cl.
| | | |
|---|---|---|
| *C09K 11/02* | (2006.01) | |
| *C09K 11/88* | (2006.01) | |
| *C09K 11/56* | (2006.01) | |
| *C09K 11/70* | (2006.01) | |
| *H01L 33/06* | (2010.01) | |
| *B82Y 40/00* | (2011.01) | |
| *B82Y 20/00* | (2011.01) | |
| *H10K 50/115* | (2023.01) | |

(52) U.S. Cl.
CPC .......... *C09K 11/025* (2013.01); *C09K 11/562* (2013.01); *C09K 11/565* (2013.01); *C09K 11/70* (2013.01); *C09K 11/703* (2013.01); *C09K 11/883* (2013.01); *H01L 33/06* (2013.01); *B82Y 20/00* (2013.01); *B82Y 40/00* (2013.01); *H10K 50/115* (2023.02)

(58) Field of Classification Search
CPC ..... C09K 11/02; C09K 11/565; C09K 11/883; C09K 11/70; C09K 11/703; H01L 51/502
See application file for complete search history.

(56) References Cited

U.S. PATENT DOCUMENTS

| | | |
|---|---|---|
| 9,517,936 B2 | 12/2016 | Jeong et al. |
| 10,074,770 B2 | 9/2018 | Park et al. |
| 10,429,033 B2 | 10/2019 | Yoon et al. |
| 11,254,863 B2* | 2/2022 | Kim .................. C09K 11/70 |
| 2018/0315600 A1 | 11/2018 | Kurley et al. |
| 2019/0006556 A1 | 1/2019 | Park et al. |
| 2020/0263083 A1 | 8/2020 | Kim et al. |

FOREIGN PATENT DOCUMENTS

| | | |
|---|---|---|
| KR | 1480475 B1 | 1/2015 |
| KR | 10-20170044791 A | 4/2017 |
| KR | 10-20170074585 A | 6/2017 |
| KR | 1762728 B1 | 7/2017 |
| KR | 10-20180059363 A | 6/2018 |
| WO | 10-2017079225 A1 | 5/2017 |

* cited by examiner

*Primary Examiner* — C Melissa Koslow
(74) *Attorney, Agent, or Firm* — Cantor Colburn LLP

(57) ABSTRACT

Quantum dots including semiconductor nanocrystals, methods of producing the same, and quantum dot solutions and electronic devices including the same. The quantum dots do not include cadmium, lead, or a combination thereof. The quantum dots include an organic ligand and a halogen on the surfaces, and the quantum dots are dispersible in an organic solvent to form organic solutions.

19 Claims, 9 Drawing Sheets

QUANTUM DOTS AND QUANTUM DOT SOLUTIONS

CROSS-REFERENCE TO RELATED APPLICATION

This is a continuation application of U.S. application Ser. No. 16/791,327, filed Feb. 14, 2020, now U.S. Patent No. 11,254,863, which in turn claims priority to Korean Patent Application No. 10-2019-0018227 filed in the Korean Intellectual Property Office on Feb. 19, 2019, and all the benefits accruing therefrom under 35 U.S.C. §§ 119,120, the contents of which in their entirety are herein incorporated by reference.

BACKGROUND

1. Field

Quantum dots, quantum dot solutions, and an electroluminescent device that include the quantum dots, or are manufactured with the quantum dot solutions, are disclosed.

2. Description of the Related Art

Quantum dots that are semiconductor nanocrystals may have different energy bandgaps by controlling the particle size and composition. Such quantum dots may be prepared and emit light of various wavelengths. The quantum dots may be applied to various electronic devices such as an electroluminescent device, including in displays.

SUMMARY

An embodiment provides quantum dots capable of exhibiting improved electroluminescence properties.

Another embodiment provides a method of producing the quantum dots.

Another embodiment provides an organic solution including the quantum dots.

Another embodiment provides a light emitting device including the plurality of quantum dots.

An embodiment provides quantum dots including semiconductor nanocrystals, wherein the quantum dots do not include cadmium, lead, or a combination of cadmium and lead. The quantum dots include an organic ligand and a halogen on the surfaces of the quantum dots. The amount of the organic ligand is less than or equal to about 10 wt % based on a total weight of the quantum dots, and the quantum dots are dispersible in an organic solvent to form an organic solution. An amount of the halogen may be greater than or equal to about 1 microgram per one milligram of quantum dots (ug/mg QD) and less than about 30 ug/mg QD, for example, less than or equal to about 25 ug/mg QD, or less than or equal to about 20 ug/mg QD.

The quantum dots may have a core shell structure having a core including a first semiconductor nanocrystal and a shell disposed on the core, the shell including a second semiconductor nanocrystal having a different composition from the first semiconductor nanocrystal.

The first semiconductor nanocrystal may include a Group II-VI compound, Group III-V compound, or a combination thereof.

The second semiconductor nanocrystal may include a Group II-VI compound, a Group III-V compound, or a combination thereof.

The first semiconductor nanocrystal may include a metal including indium, zinc, or a combination thereof, and a non-metal including phosphorus, selenium, tellurium, sulfur, or a combination thereof.

The second semiconductor nanocrystal may include a metal including indium, zinc, or a combination thereof, and a non-metal including phosphorus, selenium, tellurium, sulfur, or a combination thereof.

The first semiconductor nanocrystal may include InP, InZnP, ZnSe, ZnSeS, ZnSeTe, or a combination thereof.

The second semiconductor nanocrystal may include ZnSe, ZnSeS, ZnS, ZnTeSe, or a combination thereof.

The shell may include zinc, sulfur, and optionally selenium, in an outermost layer of the shell.

The halogen may include chlorine.

A mole ratio of the halogen relative to the organic ligand may be less than about 2. A mole ratio of the halogen relative to the organic ligand may be less than or equal to about 1.6. A mole ratio of the halogen relative to the organic ligand may be greater than or equal to about 0.5. A mole ratio of the halogen relative to the organic ligand may be greater than or equal to about 0.9.

The organic ligand may include RCOOH, $RNH_2$, $R_2NH$, $R_3N$, $R_3PO$, $R_3P$, ROH, RCOOR, $RPO(OH)_2$, RHPOOH, $R_2POOH$, or a combination thereof (wherein, R is each independently a C3 to C40 substituted or unsubstituted aliphatic hydrocarbon group, a C6 to C40 substituted or unsubstituted aromatic hydrocarbon group, or a combination thereof).

The organic ligand may include a C6 to C40 aliphatic carboxylic acid compound.

The quantum dots may not include a thiol-containing organic compound or a salt thereof bound to a surface of the quantum dots. In particular, the thiol-containing organic compound or the salt thereof that may not be included, or may not be present on a surface of the quantum dots, include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin, 2-mercaptopropionic acid, a 2-mercaptopropionate ester, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol, dialkyldithiocarbamic acid or a metal salt thereof, or a combination thereof.

The quantum dots may exhibit a maximum photoluminescence peak in a wavelength range of greater than or equal to about 450 nm and less than or equal to about 465 nm.

The quantum dots may have quantum efficiency of greater than or equal to about 80 percent (%).

The organic solvent may include a substituted or unsubstituted C5 to C40 aliphatic hydrocarbon, a substituted or unsubstituted C6 to C40 aromatic hydrocarbon, a C3 to C40 alicyclic hydrocarbon, or a combination thereof.

The quantum dots may have an amount of an organic material of greater than or equal to about 1 wt % and less than or equal to about 10 wt % as determined (e.g., measured) by a thermogravimetric analysis.

The quantum dots may have an amount of an organic material of greater than or equal to about 5 wt % and less than or equal to about 9 wt % as determined (e.g., measured) by a thermogravimetric analysis.

The quantum dots may exhibit a 2% weight loss temperature (i.e., a temperature at which a weight percentage of 98% of the initial weight of quantum dots is observed) that is greater than about 410° C. (for example, as determined by a thermo-gravimetric analysis).

The quantum dots may form an organic solution having an average particle size of less than or equal to about 50 nanometers (nm), for example, less than or equal to about 45 nm, or less than or equal to about 40 nm, as determined by a dynamic light scattering (DLS) analysis.

The quantum dots may form an organic solution having a particle size distribution of less than or equal to about 20 nm as measured by dynamic light scattering analysis.

An embodiment provides a quantum dot solution including an organic solvent and the aforementioned quantum dots dispersed in the organic solvent.

In another embodiment, a method of producing the aforementioned quantum dots includes obtaining an organic dispersion including a plurality of quantum dots including an organic ligand on a surface the quantum dots and a first organic solvent;

obtaining a chloride solution including a metal halide and a polar organic solvent compatible with the first organic solvent; and combining the chloride solution with the organic dispersion to form a mixture, wherein an amount of the metal halide may be greater than or equal to about 0.1 wt % and less than or equal to about 10 wt % based on a total weight of the quantum dots, and stirring the mixture at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C.

In an embodiment, a volume ratio of the polar organic solvent relative to the first organic solvent is less than or equal to about 0.1.

The metal halide includes zinc, indium, gallium, magnesium, lithium, or a combination thereof.

The first organic solvent may include a substituted or unsubstituted C5 to C40 aliphatic hydrocarbon, a substituted or unsubstituted C6 to C40 aromatic hydrocarbon, a C3 to C40 alicyclic hydrocarbon, or a combination thereof.

The polar organic solvent may include a C1 to C10 alcohol, or a combination thereof.

In another embodiment, a light emitting device includes a first electrode and a second electrode facing each other, and an emission layer disposed between the first electrode and the second electrode, wherein the emission layer includes the aforementioned quantum dots.

The quantum dots may not include a thiol-containing organic compound or a salt thereof bound to a surface of the quantum dots.

The light emitting device may include an electron auxiliary layer disposed between the emission layer and the second electrode.

The electron auxiliary layer may include a nanoparticle including a zinc metal oxide represented by Chemical Formula 1:

 Chemical Formula 1 wherein, in Chemical Formula 1,

M is Mg, Ca, Zr, W, Li, Ti, Y, Al, or a combination thereof, and $0 \leq x \leq 0.5$.

The light emitting device may emit blue light.

The light emitting device may have a maximum luminance of greater than or equal to about 10,000 candela per square meter ($cd/m^2$).

The light emitting device may have T50 of greater than or equal to about 20 hours.

Another embodiment provides a display device including the aforementioned light emitting device (e.g., electroluminescent device).

The quantum dots according to an embodiment may maintain a stable colloid (e.g., a colloidal dispersion) for various organic solvents while exhibiting improved optical properties. A light emitting device (e.g., an electroluminescent device) including the quantum dots according to an embodiment may exhibit improved luminance and extended life-span characteristics.

DETAILED DESCRIPTION

Figure 1:
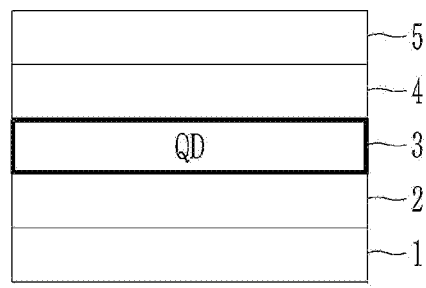
FIG. 1 is a schematic cross-sectional view of a QD LED device according to non-limiting embodiments.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

If not defined otherwise, all terms (including technical and scientific terms) in the specification may be defined as commonly understood by one skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" or "includes"

and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, the singular includes the plural unless mentioned otherwise.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. In order to clearly illustrate the embodiments in the drawings, some portions not really relevant to the explanation may be omitted.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer or section from another element, component, region, layer, or section. Thus, "a first element," "component," "region," "layer" or "solvent" discussed below could be termed a second element, component, region, layer or solvent without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% or 5% of the stated value.

As used herein, when a definition is not otherwise provided, "substituted" refers to the case where in a compound or a functional group, hydrogen is replaced by a substituent selected from a C1 to C30 an alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

The wording "aliphatic" may refer to a C1 to C30 linear or branched alkyl (alkenyl, or alkynyl) group but is not limited thereto.

As used herein, when a definition is not otherwise provided, "alkoxy" refers to an alkyl group that is linked via an oxygen (i.e., alkyl-O—), for example methoxy, ethoxy, and sec-butyloxy groups.

As used herein, when a definition is not otherwise provided, "alkyl" refers to a linear or branched saturated monovalent hydrocarbon group (methyl, ethyl, hexyl, etc.). Unless indicated otherwise, an "alkyl" may have any number of carbon atoms, e.g., from 1 to 60 carbon atoms, or 1 to 32 carbon atoms, or 1 to 24 carbon atoms, or 1 to 12 carbon atoms.

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, an "amine" group has the general formula —NRR, wherein each R is independently hydrogen, a C1-C12 alkyl group, a C7-C20 alkylarylene group, a C7-C20 arylalkylene group, or a C6-C18 aryl group.

As used herein, "Group" in the term Group II, Group III, and the like refers to a group of Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

Quantum dots (e.g., semiconductor nanocrystal particles) may have a theoretical quantum yield (QY) of 100 percent (%) and emit light having a high color purity (e.g., having a full width at half maximum (FWHM) of less than or equal to about 40 nm). The quantum dots in an electroluminescent device may enhance a luminous efficiency and improve color reproducibility in an application as a light emitting material. An electroluminescent display device is a display device capable of being driven without an external light source. The electroluminescent display device includes a light emitting device including an electroluminescent material. In the light emitting device, electrons and holes injected from the first and second electrodes combine in the emission layer to form an exciton, and the excitons emit light.

Most of quantum dots having photoluminescence properties at an actually applicable level may be based on, i.e., include cadmium (Cd). Lead-containing quantum dots may also show improved optical properties. However, lead and cadmium may cause severe environment/health problems and a restricted element by Restriction of Hazardous Substances Directive (RoHS) in a plurality of countries. Therefore, it is desired to develop environmentally-friendly quantum dots which may emit light of a desired wavelength while having improved light emitting characteristics (for example, applied to an electroluminescent device) and does not include harmful heavy metals such as cadmium, lead, or a combination thereof.

Quantum dots according to an embodiment may simultaneously have a controlled amount of a halogen and an organic ligand on the surfaces and thereby exhibit increased optical properties and accordingly, contribute to improving optical characteristics and increasing a life-span as applied to an electroluminescent device. The quantum dots according to an embodiment may exhibit unique surface properties due to the exchange of halogen for a portion of the organic ligand on the surfaces of the quantum dots. Accordingly, an amount of organic material on the surface of the quantum dots can be controlled or adjusted. Accordingly, the quantum dots may maintain satisfactory dispersibility with respect to various organic solvents and cause little if any (e.g., no substantial) aggregation and/or precipitation. The resulting quantum dots may be applied to, for example, an electroluminescent device and the like through a solution process, whereby providing a controlled balance between electrons and holes and providing improved electroluminescence properties.

Accordingly, quantum dots of an embodiment including semiconductor nanocrystals do not include cadmium, lead, or a combination thereof. The quantum dots include an organic ligand and a halogen (e.g., bound to) on their surfaces. An amount of the organic ligand is less than or equal to about 10 wt % based on a total weight of the quantum dots. In the quantum dots according to an embodiment, (for example, as determined by an ion chromatography), an amount of the halogen may be greater than or equal to about 1 microgram per milligram of the quantum dots (ug/mg QD), greater than or equal to about 1.5 ug/mg QD, greater than or equal to about 3 ug/mg QD, greater than or equal to about 4 ug/mg QD, greater than or equal to about 5 ug/mg QD, greater than or equal to about 6 ug/mg QD, greater than or equal to about 7 ug/mg QD, greater than or equal to about 8 ug/mg QD, greater than or equal to about 9 ug/mg QD, greater than or equal to about 10 ug/mg QD, greater than or equal to about 11 ug/mg QD, greater than or equal to about 12 ug/mg QD, greater than or equal to about 12.5 ug/mg QD, greater than or equal to about 13 ug/mg QD, greater than or equal to about 14 ug/mg QD, greater than or equal to about 15 ug/mg QD, greater than or equal to about 16 ug/mg QD, greater than or equal to about 17 ug/mg QD, greater than or equal to about 18 ug/mg QD, or greater than or equal to about 19 ug/mg QD and less than about 30 ug/mg QD, less than or equal to about 25 ug/mg QD, less than or equal to about 20 ug/mg QD, less than or equal to about 19.5 ug/mg QD, less than or equal to about 19 ug/mg QD, less than or equal to about 18 ug/mg QD, less than or equal to about 17 ug/mg QD, less than or equal to about 15 ug/mg QD, less than or equal to about 12.5 ug/mg QD, or less than or equal to about 12 ug/mg QD.

By the adoption of the aforementioned surface structure, the quantum dots may be dispersible (e.g., without causing substantial aggregation) in an organic solvent, and upon dispersion form an organic solution, e.g., a transparent organic solution. For example, the organic solution may be transparent to the naked eye. In an embodiment, the quantum dot solutions (that are prepared with substantially no aggregation) may not include a particle aggregate having a size of greater than or equal to about 1 micrometer (µm), greater than or equal to about 100 nanometers (nm), or greater than or equal to about 50 nm. In an embodiment, the quantum dot solutions (that are prepared with substantially no aggregation) may exhibit an average particle sizes of less than or equal to about 55 nm, less than or equal to about 50 nm, less than or equal to about 45 nm, less than or equal to about 40 nm, less than or equal to about 35 nm, less than or equal to about 30 nm, less than or equal to about 25 nm, or less than or equal to about 20 nm, for example, as measured by a dynamic light scattering (DLS) method. In an embodiment, the quantum dot solutions (that are prepared with substantially no aggregation) may have a standard deviation or a sigma-value ($\sigma$) of particle sizes measured by DLS of less than or equal to about 300 nm, less than or equal to about 200 nm, less than or equal to about 150 nm, less than or equal to about 120 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm.

The semiconductor nanocrystal may include a Group II-VI compound, a Group III-V compound, a Group IV-VI compound, a Group IV element or compound, a Group compound, a Group I-II-IV-VI compound, or a combination thereof.

In an embodiment, the quantum dots may have a core shell structure and may include a core including a first semiconductor nanocrystal and a shell disposed on the core, the shell including a second semiconductor nanocrystal having a different composition from the first semiconductor nanocrystal. The first semiconductor nanocrystal may include a Group II-VI compound, a Group III-V compound, or a combination thereof. The second semiconductor nanocrystal may include a Group II-VI compound, a Group III-V compound, or a combination thereof.

The Group II-VI compound may include a binary element compound including ZnS, ZnSe, ZnTe, ZnO, HgS, HgSe, HgTe, MgSe, MgS, or a mixture thereof; a ternary element compound including ZnSeS, ZnSeTe, ZnSTe, HgSeS, HgSeTe, HgSTe, HgZnS, HgZnSe, HgZnTe, MgZnSe, MgZnS, or a mixture thereof; or a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include a Group III metal.

The Group III-V compound may include a binary element compound including GaN, GaP, GaAs, GaSb, AlN, AlP, AlAs, AlSb, InN, InP, InAs, InSb, or a mixture thereof; a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, or mixture thereof; or a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or mixture thereof. The Group III-V compound may further include a Group II element. Examples of such a semiconductor nanocrystal may be InZnP.

The Group IV-VI compound may include a binary element compound including SnS, SnSe, SnTe, or a mixture thereof; a ternary element compound including SnSeS, SnSeTe, SnSTe, or a mixture thereof; or a quaternary element compound including SnSSeTe.

Examples of the Group compound may include $CuInSe_2$, $CuInS_2$, CuInGaSe, or CuInGaS but are not limited thereto.

Examples of the Group I-II-IV-VI compound may include CuZnSnSe or CuZnSnS but are not limited thereto.

The Group IV element or compound may include a single-element including Si, Ge, or a combination thereof; or a binary element compound including SiC, SiGe, or a mixture thereof.

In an embodiment, the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof and a non-metal including phosphorus, selenium, tellurium, sulfur, or a combination thereof. In an embodiment, the first semiconductor nanocrystal may include InP, InZnP, ZnSe, ZnSeS, ZnSeTe, or a combination thereof and/or the second semiconductor nanocrystal may include ZnSe, ZnSeS, ZnS, ZnTeSe, ZnSeSTe, or a combination thereof.

The binary element compound, the ternary element compound, or the quaternary element compound may be respectively included in the particle at a uniform concentration or at partially different or gradient concentrations.

In an embodiment, when the quantum dots have a core shell structure, on the interface between the core and the shell, an alloyed interlayer may be present or may not be present. The alloyed layer may include a homogeneous alloy or may have a concentration gradient. The gradient alloy may have a concentration gradient wherein the concentration of an element of the shell radially changes (e.g., decreases or increases toward the core).

In an embodiment, the shell may be a multi-layered shell including two or more layers. In the multi-layered shell, adjacent two layers may have different compositions from each other. In the multi-layered shell, at least one layer may independently include a semiconductor nanocrystal having a single composition. In the multi-layered shell, at least one layer may independently have an alloyed semiconductor nanocrystal. In the multi-layered shell, at least one layer may have a concentration gradient that radially changes in terms of a composition of a semiconductor nanocrystal.

In the core shell quantum dot, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (layers that are closer to the core). In the case of the multi-layered shell, a semiconductor nanocrystal of each layer is selected to have an appropriate bandgap, thereby effectively showing a quantum confinement effect.

In an embodiment, the quantum dots may have a core including ZnSeSTe, ZnSeTe, ZnSe, or a combination thereof and a shell including ZnSeS. The shell may have a composition which is changed in a radial direction. For example, an amount of sulfur in the shell may increase or decrease in a radial direction (i.e., from the core toward the surface). In an embodiment, the shell may include zinc, sulfur, and optionally selenium, in an outermost layer.

The quantum dots of an embodiment include for example a halogen and an organic ligand, each of which may be bound or coordinated to the surface.

The organic ligand may include RCOOH, $RNH_2$, $R_2NH$, $R_3N$, $R_3PO$, $R_3P$, ROH, RCOOR, $RPO(OH)_2$, RHPOOH, $R_2POOH$, or a combination thereof wherein R is each independently a C3 to C40 substituted or unsubstituted aliphatic hydrocarbon group (e.g., an alkyl group, an alkenyl group, or an alkynyl group), a C6 to C40 substituted or unsubstituted aromatic hydrocarbon group (an aryl group), or a combination thereof).

Specific examples of the organic ligand compound may be methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributyl phosphine, trioctyl phosphine, and the like; a phosphine oxide compound such as methyl phosphine oxide, ethyl phosphine oxide, propyl phosphine oxide, butyl phosphine oxide, trioctylphosphine oxide, and the like; diphenyl phosphine, a triphenyl phosphine compound, or an oxide compound thereof; a phosphinic acid; a phosphonic acid; and the like, but are not limited thereto. The organic ligand compound may be used alone or as a mixture of two or more.

The organic ligand may include a C6 to C40 aliphatic carboxylic acid compound (e.g., myristic acid, oleic acid, stearic acid, etc.). The carboxylic acid compound may include a compound represented by RCOOH (wherein, R is C12 or more (or C18 or more and/or C35 or less or C30 or less) alkyl group or C12 or more (or C18 or more and/or C35 or less or C30 or less) alkenyl group).

The halogen may be chlorine, bromine, iodine, or a combination thereof. The halogen may include chlorine, or consist essentially of chlorine.

In the quantum dots of an embodiment, the halogen may be included in an amount of greater than or equal to about 1 microgram per milligram of quantum dots (ug/mg QD), for example, greater than or equal to about 2 ug/mg QD, greater than or equal to about 3 ug/mg QD, greater than or equal to about 4 ug/mg QD, greater than or equal to about 5 ug/mg QD, greater than or equal to about 6 ug/mg QD, or greater than or equal to about 7 ug/mg QD and less than about 30 ug/mg QD, for example, less than or equal to about 25 ug/mg QD, less than or equal to about 20 ug/mg QD, less than or equal to about 12.4 ug/mg QD, less than or equal to about 12.3 ug/mg QD, less than or equal to about 12.2 ug/mg QD, less than or equal to about 12.1 ug/mg QD, less than or equal to about 12 ug/mg QD, less than or equal to about 11.9 ug/mg QD, or less than or equal to about 11.8 ug/mg QD.

Without wishing to be bound by any particular theory, the halogen within the amount ranges listed above may provide efficient passivation of the surface of the quantum dots, and the quantum dots may exhibit improved luminescence properties and/or contribute to securing the balance of holes and electrons as applied to an electroluminescent device.

Again, without wishing to be bound by any particular theory, the aforementioned amount of halogen may also make it possible for the quantum dots to maintain an improved level of dispersibility for various organic solvents. The organic solvent may include a substituted or unsubstituted C3 to C40 aliphatic hydrocarbon, a substituted or unsubstituted C6 to C40 aromatic hydrocarbon, a substituted or unsubstituted C3 to C40 alicyclic hydrocarbon, or a combination thereof.

The mole ratio of the halogen (e.g., chlorine) relative to the organic ligand (e.g., fatty acid such as oleic acid) may be less than about 2.2, for example, less than or equal to about 2, less than or equal to about 1.9, less than or equal to about 1.8, less than or equal to about 1.7, or less than or equal to about 1.6. The mole ratio of the halogen relative to the organic ligand may be greater than or equal to about 0.5, for example, greater than or equal to about 0.6, greater than or equal to about 0.7, greater than or equal to about 0.8, or greater than or equal to about 0.9.

The quantum dots may not include a thiol-containing organic compound or a salt thereof which is bound to the surfaces thereof. A list of thiol-containing organic compounds or the salts thereof that may not be present include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin (2-(2-sulfanylpropanoylamino)acetic acid), 2-mercaptopropionic acid, 2-mercaptopropionate, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol (m(PEG)-SH), dialkyldithiocarbamic acid or a metal salt thereof, or a combination thereof.

The quantum dots having the aforementioned surface characteristics according to an embodiment may exhibit improved luminescence properties (e.g., improvement in quantum efficiency, a reduction in full width at half maximum (FWHM), and the like) within a desired wavelength range.

Accordingly, the quantum dots of an embodiment may have quantum efficiency of greater than or equal to about 60 percent (%), for example, greater than or equal to about 70%, or greater than or equal to about 80% as well as a desired photoluminescence peak wavelength. The photoluminescence peak wavelength may be present in a wavelength range of an ultraviolet (UV) region to a near infrared region. The maximum photoluminescence peak wavelength may be present in a range of about 420 nm to about 750 nm. Green light emitting quantum dots may exhibit a maximum photoluminescence peak wavelength in a range of greater than or equal to about 500 nm, for example, greater than or equal to about 510 nm and less than or equal to about 550 nm, for example, less than or equal to about 540 nm. Red light emitting quantum dots may exhibit a maximum photoluminescence peak wavelength in a range of greater than or equal to about 600 nm, for example, greater than or equal to about 610 nm, or for example, greater than or equal to about 650 nm and for example, less than or equal to about 640 nm. Blue light emitting quantum dot may exhibit a maximum photoluminescence peak wavelength in a range of greater than or equal to about 440 nm, for example, greater than or equal to about 445 nm, greater than or equal to about 450 nm, or for example, greater than or equal to about 470 nm and for example, less than or equal to about 460 nm.

The quantum dots may exhibit a photoluminescence spectrum having a relatively narrow full width at half maximum (FWHM). In an embodiment, the quantum dots may exhibit a full width at half maximum (FWHM) of less than or equal to about 45 nm, for example less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 30 nm, less than or equal to about 29 nm, less than or equal to about 28 nm, or less than or equal to about 27 nm in the photoluminescence spectra.

The quantum dots of an embodiment may include a reduced level of organic material, the organic material including the amount of organic ligand compared to known quantum dots infra. For example, quantum dots synthesized using methods according to conventional methods in the art include an organic material (e.g., a solvent, an organic ligand, and the like) that coordinates to the quantum dots during the synthesis in an amount of greater than or equal to about 20 wt % and less than or equal to about 35 wt % based on a total weight of the quantum dots. The aforementioned amount of the organic material may be required for dispersibility though work as a barrier with respect to electron and hole injection, and thereby, substantially deteriorate luminous efficiency.

The quantum dots of an embodiment may form an organic solution without substantial aggregation as well as provide a controlled level of the organic material having the aforementioned surface characteristics. The quantum dots may have an amount of an organic material of greater than or equal to about 1 wt %, for example, greater than or equal to about 2 wt %, greater than or equal to about 3 wt %, greater than or equal to about 4 wt %, greater than or equal to about 5 wt %, or greater than or equal to about 6 wt % as determined by a thermogravimetric analysis. The quantum dots may have an amount of an organic material of less than or equal to about 10 wt %, less than or equal to about 9.5 wt %, less than or equal to about 9 wt %, or less than or equal to about 8 wt % as determined by a thermogravimetric analysis (TGA).

In the TGA analysis of the quantum dots of an embodiment, a residue amount (weight) determined at about 600° C. may be greater than or equal to about 90 wt %, or greater than or equal to about 91 wt %, or greater than or equal to about 92 wt % with respect to a total weight of the quantum dots (i.e., the initial weight prior to the TGA analysis).

As such, the quantum dots of the embodiments may include a limited amount of a surface-bound organic materials together with a controlled amount of halogen. The amount of the surface-bound organic materials can be measured by thermogravimetric analysis (TGA). In an embodiment, the quantum dots may have a 2% weight loss temperature (i.e., a temperature at which a weight percentage is 98% of the initial weight of quantum dots) that may be greater than about 410° C., for example, greater than or equal to about 415° C., or greater than or equal to about 420° C., as measured by the TGA.

Therefore, an embodiment provides quantum dot solutions including the aforementioned quantum dots and organic solvent. Details for the quantum dot organic solutions are the same as described above for quantum dot solutions (e.g., quantum dots without substantial aggregation).

The quantum dots having the aforementioned surface properties may be produced by a method including obtaining an organic dispersion including a plurality of quantum dots including organic ligands on the surfaces of the quantum dots and a first organic solvent;

obtaining a chloride solution including a polar organic solvent compatible with the first organic solvent and a metal halide; and combining the chloride solution with the organic dispersion to form a mixture, wherein an amount of the metal halide based on a total weight of the quantum dots may be greater than or equal to about 0.1 wt % and less than or equal to about 10 wt %, and stirring the mixture at a temperature of greater than or equal to about 45° C. (or greater than or equal to about 60° C. and less than or equal to about 150° C.

An amount of the metal halide may be for example, greater than or equal to about 0.01 wt %, greater than or equal to about 0.1 wt %, greater than or equal to about 0.2 wt %, greater than or equal to about 0.3 wt %, greater than or equal to about 0.4 wt %, greater than or equal to about 0.5 wt %, greater than or equal to about 0.6 wt %, greater than or equal to about 0.7 wt %, greater than or equal to about 0.8 wt %, greater than or equal to about 0.9 wt %, greater than or equal to about 1 wt %, greater than or equal to about 1.1 wt %, greater than or equal to about 1.2 wt %, greater than or equal to about 1.3 wt %, greater than or equal to about 1.4 wt %, greater than or equal to about 1.5 wt %, greater than or equal to about 1.6 wt %, greater than or equal to about 1.7 wt %, greater than or equal to about 1.8 wt %, greater than or equal to about 1.9 wt %, greater than or equal to about 2 wt %, greater than or equal to about 2.1 wt %, greater than or equal to about 2.2 wt %, greater than or equal to about 2.3 wt %, greater than or equal to about 2.4 wt %, greater than or equal to about 2.5 wt %, greater than or equal to about 2.6 wt %, greater than or equal to about 2.7 wt %, greater than or equal to about 2.8 wt %, greater than or equal to about 2.9 wt %, or greater than or equal to about 3 wt %, each of which is based on a total weight of the quantum dots. An amount of the metal halide may be greater than or equal to about 3.5 wt %, greater than or equal to about 4 wt %, greater than or equal to about 4.5 wt %, greater than or equal to about 5 wt %, or greater than or equal to about 5.5 wt %, each of which is based on a total weight of the quantum dots. An amount of the metal halide may be less than or equal to about 9 wt %, less than or equal to about 8.5 wt %, less than or equal to about 8 wt %, less than or equal to about 7.5 wt %, less than or equal to about 7 wt %, less than or equal to about 6.5 wt %, or less than or equal to about 6 wt %, each of which is based on a total weight of the quantum dots.

The plurality of quantum dots may be synthesized by any method (e.g., by a suitable colloidal synthesis method or a wet chemical process). Details of the specific composition, size, structure, etc. of a plurality of quantum dots are described as above. In an embodiment such as a wet chemical process, a crystal grain may grow by reacting precursor materials in an organic solvent, the grain growth may be controlled by coordinating the organic solvent or organic ligands on the surface of the semiconductor nanocrystals. Then any extra organic material not coordinated to the surfaces of the semiconductor nanocrystals may be removed via a separation process, e.g., with a non-solvent after the synthesis to provide quantum dots coordinating with the organic ligands.

Types of the first organic solvent are not particularly limited, and the aforementioned organic solvent may be used. A concentration of the quantum dots in the organic dispersion may be selected by considering an amount of the metal halide to be added and a volume of the chloride solution. The concentration of the quantum dots in the organic dispersion may be greater than or equal to about 0.01 milligram per milliliter (mg/mL), greater than or equal to about 0.1 mg/mL, greater than or equal to about 1 mg/mL, greater than or equal to about 5 mg/mL, greater than or equal to about 10 mg/mL, greater than or equal to about 15 mg/mL, or greater than or equal to about 20 mg/mL. The concentration of the quantum dots in the organic dispersion may be less than or equal to about 100 mg/mL, less than or equal to about 50 mg/mL, or less than or equal to about 30 mg/mL.

A volume ratio of the polar organic solvent relative to the first organic solvent may be less than or equal to about 0.1, less than or equal to about for example, 0.09, less than or equal to about 0.08, less than or equal to about 0.07, less than or equal to about 0.06, less than or equal to about 0.05, less than or equal to about 0.04, less than or equal to about 0.03, or less than or equal to about 0.02.

The metal halide includes zinc, indium, gallium, magnesium, lithium, or a combination thereof. The metal halide may include metal chloride. The metal halide may include zinc halide. In an embodiment, the metal halide may include zinc chloride, zinc bromide, zinc iodide, indium chloride, indium bromide, indium iodide, gallium chloride, gallium bromide, gallium iodide, magnesium chloride, magnesium bromide, magnesium iodide, a lithium chloride, lithium bromide, lithium iodide, or a combination thereof.

The first organic solvent may include a substituted or unsubstituted C5 to C40 aliphatic hydrocarbon, a substituted or unsubstituted C6 to C40 aromatic hydrocarbon, a substituted or unsubstituted C3 to C40 alicyclic hydrocarbon, or a combination thereof.

The polar organic solvent may include C1 to 010 alcohol, or a combination thereof. For example, the polar solvent may include, for example, methanol, ethanol, propanol, isopropanol, butanol, pentanol, hexanol, heptanol, or a combination thereof.

In another embodiment, an electronic device includes the quantum dots described herein. The device may include a display device, a light emitting diode (LED), an organic light emitting diode (OLED), a quantum dot LED, a sensor, a solar cell, an imaging sensor, or a liquid crystal display, but is not limited thereto.

In an embodiment, the electronic device may be a photoluminescent device (e.g., a lighting device such as a quantum dot sheet or a quantum dot rail, a liquid crystal display (LCD), etc.) or an electroluminescent device (e.g., QD LED). In another non-limiting embodiment, the electronic device may include a quantum dot sheet and the aforementioned semiconductor nanocrystal particles may be included in a quantum dot sheet (e.g., in a form of a semiconductor nanocrystal-polymer composite).

In an embodiment, the electronic device may be a liquid crystal display (LCD), a photoluminescent device (e.g., a lighting device such as a quantum dot sheet or a quantum dot rail), an electroluminescent device (e.g., QD LED), or a backlight unit.

In another non-limiting embodiment, the electronic device may include a quantum dot sheet and the aforementioned quantum dots may be included in a quantum dot sheet (e.g., in a form of a semiconductor nanocrystal-polymer composite).

In a non-limiting embodiment, the electronic device may be an electroluminescent device. The electronic device may include an anode 1 and a cathode 5 facing each other and quantum dot emission layer 3 disposed between the anode and the cathode and including a plurality of quantum dots, wherein the plurality of quantum dots may include the aforementioned quantum dots, see FIG. 1. The quantum dots may not include a thiol-containing organic compound or a salt thereof, which is bound to the surfaces of the quantum dots.

The cathode may include an electron injecting conductor (e.g., having a relatively low work function). The anode may include a hole injection conductor (e.g., having a relatively high work function). The electron/hole injection conductor may include a metal-containing material (e.g., a metal, a metal compound, an alloy, or a combination thereof) (aluminum, magnesium, tungsten, nickel, cobalt, platinum, palladium, calcium, LiF, and the like), metal oxide such as gallium indium oxide, indium tin oxide, and the like, or a conductive polymer (e.g., having a relatively high work function) such as polyethylene dioxythiophene, but is not limited thereto.

At least one of the cathode and the anode may be a light-transmitting electrode or a transparent electrode. In an embodiment, the anode and the cathode may be all light-transmitting electrodes. The electrode may be patterned.

The light-transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer but is not limited thereto. When one of the cathode and the anode is a non-light transmitting electrode, it may be made of, for example, an opaque conductor such as aluminum (Al), a lithium aluminum (Li:Al) alloy, a magnesium-silver alloy (Mg:Ag), or lithium fluoride-aluminum (LiF:Al).

The light-transmitting electrode may be disposed on a (e.g., insulating) transparent substrate. The substrate may be rigid or flexible. The substrate may be a plastic, glass, or a metal.

Thicknesses of the anode and the cathode are not particularly limited and may be appropriately selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 μm, less than or equal to about 1 μm, less than or equal to about 900 nm, less than or equal to about 500 nm, or less than or equal to about 100 nm, but is not limited thereto.

The quantum dot emission layer includes the aforementioned quantum dots. Details for the quantum dots are the same as described above. The quantum dot emission layer may include a monolayer of the quantum dots.

The quantum dot emission layer may be formed by applying dispersion in which the quantum dots are dispersed in a solvent by spin coating, inkjet or spray coating, and then drying the resultant layer. The emission layer may be formed to have a thickness of greater than or equal to about 5 nm, greater than or equal to about 10 nm, greater than or equal to about 15 nm, greater than or equal to about 20 nm, or greater than or equal to about 25 nm and less than or equal to about 200 nm, for example less than or equal to about 150 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include a charge (hole or electron) auxiliary layer between the anode and the cathode. For example, the electronic device may include a hole auxiliary layer 2 or an electron auxiliary layer 4 between the anode and the quantum dot emission layer and/or between the cathode and the quantum dot emission layer, see FIG. 1. As shown, the hole/electron auxiliary layer is formed as a monolayer. However, the hole/electron auxiliary layer may be formed of plural layers including two or more stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be appropriately selected. For example, each thickness of the layer may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating etc.) such as PEDOT:PSS. The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be appropriately selected. For example, each thickness of the layer may be greater than or equal to about 1 nm, greater than or equal to about 5 nm, greater than or equal to about 10 nm, greater than or equal to about 15 nm, greater than or equal to about 20 nm, or greater than or equal to about 25 nm and, less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The electron injection layer may be an organic layer formed by deposition. The electron transport layer may include an inorganic oxide nanoparticle or may be an organic layer formed by deposition.

The light emitting device may include an electron auxiliary layer disposed between the emission layer and the second electrode.

The electron auxiliary layer may include a nanoparticle including a zinc metal oxide represented by Chemical Formula 1:

$$Zn_{1-x}M_xO \qquad \text{Chemical Formula 1}$$

In Chemical Formula 1,

M is Mg, Ca, Zr, W, Li, Ti, Y, Al, or a combination thereof, and $0 \leq x \leq 0.5$.

For example, the zinc metal oxide may be zinc oxide or zinc magnesium oxide. The nanoparticle may have an average particle size of greater than or equal to about 1 nm and less than or equal to about 10 nm.

The quantum dot emission layer may be disposed in the hole injection (or transport) layer or an electron injection (or transport) layer or on the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer (HIL) may independently include, for example, poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly(N-vinylcarbazole) (PVK), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)-phenylcyclohexane (TAPC), p-type metal oxide (e.g., NiO, $WO_3$, $MoO_3$, etc.), a carbon-containing material such as graphene oxide, or a combination thereof, but is not limited thereto.

The electron blocking layer (EBL) may include, for example poly(3,4-ethylenedioxythiophene):poly(styrenesulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) and/or the electron injection layer (EIL) may independently include, for example, 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto. The n-type metal oxide may be crystalline. The n-type metal oxide may be a nanoparticle. The electron transport layer may include crystalline nanoparticles including zinc oxide (e.g. ZnO).

The hole blocking layer (HBL) may include for example at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, Inq3, Znq2, $Zn(BTZ)_2$, $BeBq_2$, or a combination thereof, but is not limited thereto. Herein, q indicates 8-hydroxyquinoline, BTZ indicates 2-(2-hydroxyphenyl)-benzothiazolate, and Bq indicates 10-hydroxybenzo[h]quinolone.

Figure 2:
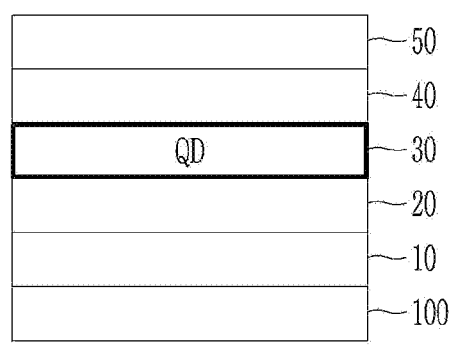
FIG. 2 is a schematic cross-sectional view of a QD LED device according to non-limiting embodiments.

A device according to an embodiment may have a normal structure. In a device according to an embodiment, an anode 10 disposed on a transparent substrate 100 may include a metal oxide-containing transparent electrode (e.g., ITO electrode) and a cathode 50 facing the anode 10 may include a metal (Mg, Al etc.) having a predetermined (relatively low) work function. For example, a hole auxiliary layer 20 may be disposed between the transparent electrode 10 and the emission layer 30, as a hole transport layer 20 including TFB and/or PVK, and/or as a hole injection layer including PEDOT:PSS and/or p-type metal oxide. An electron auxiliary layer (e.g., electron transport layer) 40 may be disposed between the quantum dot emission layer 30 and the cathode 50, see FIG. 2.

Figure 3:
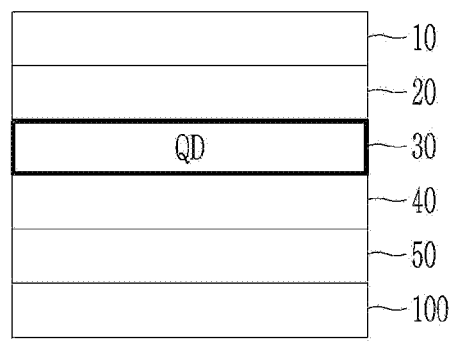
FIG. 3 is a schematic cross-sectional view of a QD LED device according to non-limiting embodiments.

A device according to another embodiment may have an inverted structure. A cathode 50 disposed on the transparent substrate 100 may include a metal oxide-containing transparent electrode (e.g., ITO) and an anode 10 facing the cathode may include a metal (Au, Ag, etc.) having a predetermined (e.g., relatively high) work function. For example, n-type metal oxide (ZnO) and the like may be disposed between the transparent electrode 50 and the emission layer 30 as an electron auxiliary layer (e.g., electron transport layer) 40. A hole auxiliary layer 20 (e.g., hole transport layer including TFB and/or PVK and/or a hole injection layer including $MoO_3$ or other p-type metal oxides) may be disposed between the metal anode 10 and the quantum dot emission layer 30, see FIG. 3.

The electroluminescent device according to an embodiment may emit green light with an improved level of an external quantum efficiency (EQE). The electroluminescent device may emit light having maximum luminance of greater than or equal to about 10,000 $cd/m^2$, greater than or equal to about 11,000 $cd/m^2$, greater than or equal to about 12,000 $cd/m^2$, greater than or equal to about 13,000 $cd/m^2$, greater than or equal to about 14,000 $cd/m^2$, or greater than or equal to about 15,000 $cd/m^2$. The electroluminescent device may have T50 of greater than or equal to about 20 hours, for example, greater than or equal to about 25 hours, greater than or equal to about 30 hours, greater than or equal to about 35 hours, or greater than or equal to about 40 hours.

Hereinafter, specific examples are presented. However, these examples are exemplary, and the present disclosure is not limited thereto.

Analysis Methods

[1] Photoluminescence Analysis

Photoluminescence (PL) spectra of the produced nanocrystals are obtained using a Hitachi F-7000 spectrometer at an irradiation wavelength of 372 nm.

[2] UV Spectroscopy

A Hitachi U-3310 spectrometer is used to perform a UV spectroscopy and obtain UV-Visible absorption spectra.

[3] ICP Analysis

An inductively coupled plasma-atomic emission spectroscopy (ICP-AES) is performed using Shimadzu ICPS-8100.

[4] TGA Analysis

The thermogravimetric analysis of the quantum dots is performed using a thermogravimetric analyzer (TA Q5000 (Q5000IR) manufactured by TA Instruments).

[5] Electroluminescence Spectroscopy

A current depending on a voltage is measured using a Keithley 2635B source meter while applying a voltage and EL light emitting luminance is measured using a CS2000 spectrometer.

[6] Manufacture of HOD

HOD (ITO/PEDOT:PSS/QD emission layer/PEDOT:PSS/Ag) is manufactured in the following method. An ITO patterned substrate is surface-treated with ultraviolet UV-ozone. A PEDOT:PSS layer is spin-coated to be 40 nm thick and then, heat-treated to remove a residual organic material. As for a hole transport layer (HTL), a TFB layer is spin-coated to be 40 nm thick and then, heat treated to remove a residual organic material. Quantum dot dispersion is spin-coated to be 35 nm to 40 nm thick to form an emission layer and then, heat-treated to remove a residual organic material. Under a mask, silver (Ag) is thermally deposited thereon to form an electrode. A sealing resin/glass is used to seal a device.

[7] Ion Chromatography Analysis

An IC analysis is performed using ICS5000/Thermo Fisher Scientific.

[8] Measurement of Average Particle Size

Dynamic light scattering (DLS) analysis is made by using a particle size analyzer (manufactured by Otsuka Electronics Co., Ltd., model name: ELSZ-2000)

Synthesis of Metal Oxide Nanoparticles

Reference Example: Synthesis of Zn Metal Oxide Nanoparticles

Zinc acetate dihydrate and magnesium acetate tetrahydrate are added to a reactor containing dimethylsulfoxide and heated at 60° C. in air. The amounts of zinc acetate dihydrate and magnesium acetate tetrahydrate are added to satisfy a mole ratio of the chemical formula below. Subsequently, an ethanol solution of tetramethylammonium hydroxide pentahydrate is added thereto in a dropwise fashion at a speed of 3 milliliters per minute (mL/min). After stirring for one hour, the prepared $Zn_xMg_{1-x}O$ nanoparticles are centrifuged and dispersed in ethanol to obtain the $Zn_xMg_{1-x}O$ nanoparticles, where x is a number in a range of greater than or equal to 0.5 and less than or equal to 1.

An X-ray diffraction analysis with respect to the obtained nanoparticles is performed to confirm that ZnO crystals are formed. A transmission electron microscopic analysis with respect to the obtained nanoparticles is performed, and indicates that the particles have an average size of about 3 nm.

Production of Quantum Dots

Comparative Example 1

[1] Production of ZnTeSe Core

Selenium and tellurium are dispersed in trioctylphosphine (TOP) to obtain a 2 molar (M Se/TOP stock solution and 1 M Te/TOP stock solution, respectively. In a 400 mL reaction flask, a trioctylamine solution including zinc acetate and palmitic acid is prepared. The solution is heated at 120° C. under vacuum. After one hour, nitrogen is introduced into the reactor to about one atmosphere.

The solution is then heated at 300° C., the Se/TOP stock solution and the Te/TOP stock solution are rapidly injected into the reaction flask and the reaction proceeds for 30 hours at 300° C. When the reaction is complete, the reaction solution is cooled down to room temperature, and acetone is added to the reaction mixture to facilitate formation of precipitate. The obtained mixture is centrifuged to separate the precipitate from the reaction solvent. The precipitate is dispersed in toluene. Tellurium (Te) is used in an amount of 0.03 moles based on 1 mole of Se, and Se is used in an amount of 2 moles based on 1 mole of Zn.

[2] Formation of ZnSeS Shell

Figure 4:
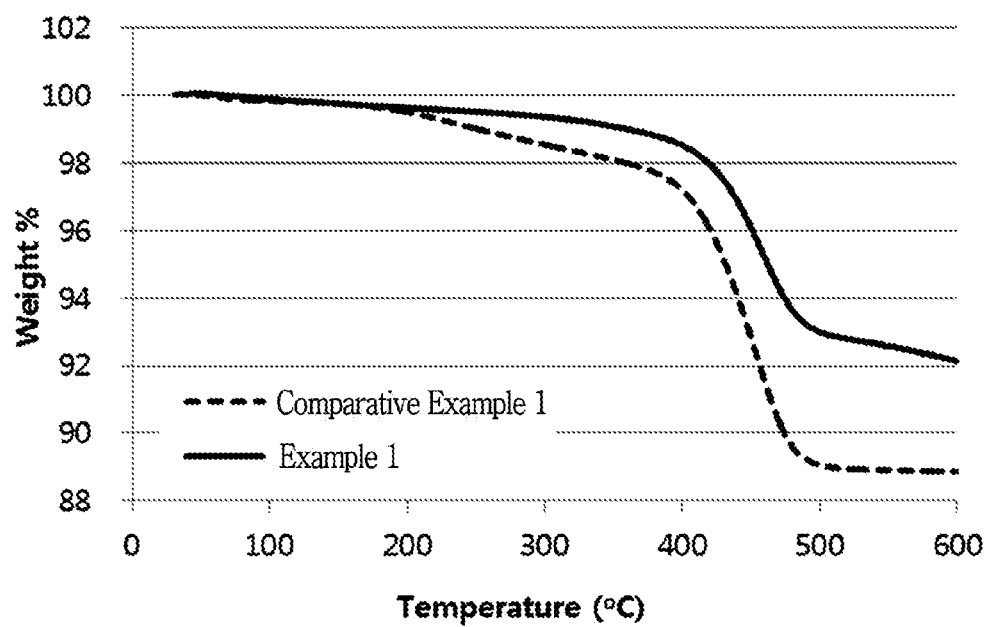
FIG. 4 shows thermogravimetric analysis results for the quantum dots of Comparative Example 1 and Example 1.

Zinc acetate and oleic acid are dissolved in trioctylamine in a 300 milliliter (mL) reaction flask that is then vacuum-treated at 120° C. for 10 minutes. The reaction flask is filled with nitrogen to about 1 atm and is heated to 280° C. A toluene dispersion of the prepared ZnTeSe core is added to the reaction flask within 10 seconds, and 1 M of Se/TOP and 1 M of S/TOP are added to the reaction flask and reacted for 120 minutes to obtain a reaction solution (Crude). When the reaction is complete, ethanol is added to the reaction solution rapidly cooled down to room temperature (24° C.) and a precipitate forms. The precipitate is centrifuged and separated to obtain ZnTeSe/ZnSeS quantum dots. The obtained quantum dots are dispersed in toluene. Se and S are respectively used in each amount of 0.5 moles and 1 mole based on 1 mole of Zn. A photoluminescence analysis, a thermogravimetric analysis, and an ion chromatography analysis are performed with respect to the quantum dots, and the results are shown in Table 1 and FIG. 4.

Example 1

Figure 7:
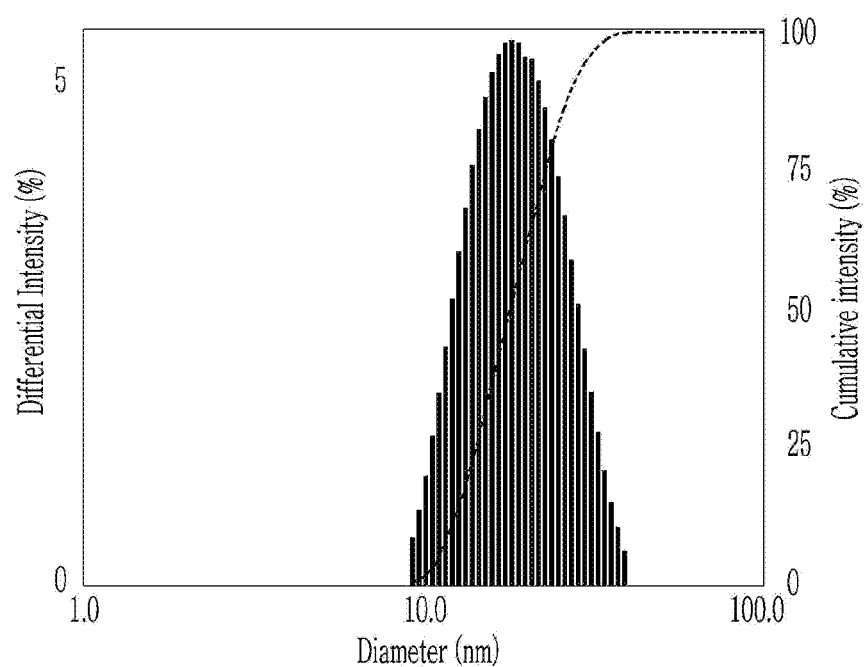
FIGS. 7, 8 and 9 illustrate the dynamic light scattering analysis results of the Example 1, Comparative Example 2, and Comparative Example 3, respectively.

A quantum dot organic dispersion is obtained by preparing ZnTeSe/ZnSeS quantum dots according to the same method as Comparative Example 1 and dispersing them in 5 mL of toluene at a concentration of 20 milligrams per milliliter (mg/mL). Zinc chloride is dissolved in ethanol to obtain a zinc chloride solution having a concentration of 10 wt %. 0.01 mL of the obtained zinc chloride solution is added to the prepared quantum dot organic dispersion and then stirred at 60° C. for 30 minutes to perform a surface exchange reaction. After the reaction, ethanol is added thereto to induce precipitation, and the quantum dots are recovered through centrifugation. With respect to the recovered quantum dots, the above described surface exchange reaction is repeated once. A photoluminescence analysis, a thermogravimetric analysis, and an ion chromatography analysis with respect to the prepared quantum dots are performed and the results are shown in Table 1 and FIG. 4. The prepared quantum dots are dispersed in toluene, and whether aggregated or not is examined by using DLS. As indicated by DLS, there is no substantial aggregation. The DLS analysis results are shown in FIG. 7 with an average particle size: 19.7 nm, σ6.2 nm.

Example 2

Surface-substituted quantum dots are prepared according to the same method as Example 1 except that the addition amount of $ZnCl_2$ is doubled. A photoluminescence analysis, a thermogravimetric analysis, and an ion chromatography analysis of the prepared quantum dots is performed and the results are shown in Table 1. The prepared quantum dots are dispersed in toluene and is examined by using DLS, which indicates that there is little or no substantial aggregation.

Example 3

Surface-substituted quantum dots are prepared according to the same method as Example 1 except that the addition amount of $ZnCl_2$ is increased five times. A photoluminescence analysis, a thermogravimetric analysis, and an ion chromatography analysis with respect to the prepared quantum dots are performed and the results are shown in Table 1.

Comparative Examples 2 and 3

Figure 8:
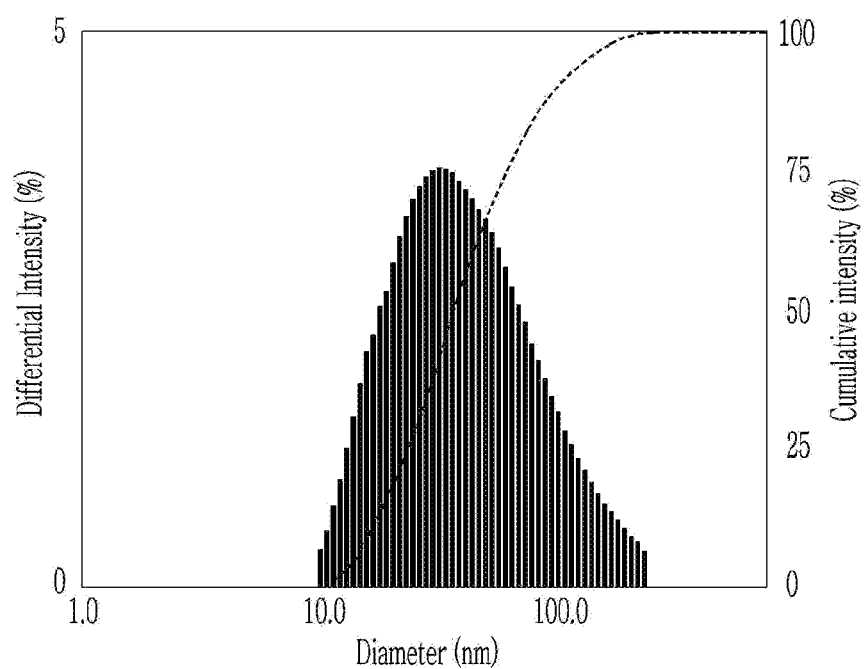
Figure 9:
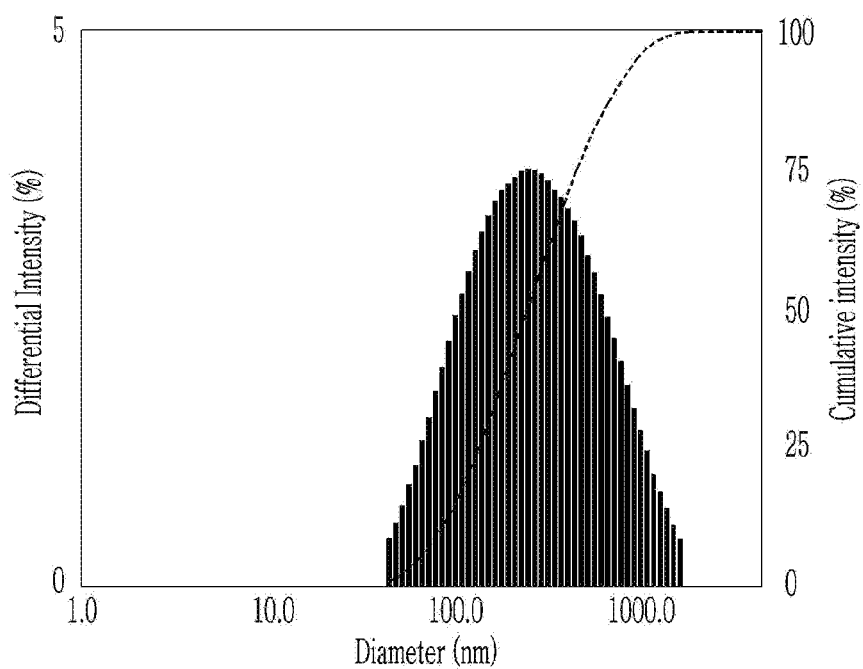

Surface-substituted quantum dots are prepared according to the same method as Example 1 except that the addition amount of $ZnCl_2$ is increased 10 times and 20 times, respectively. A photoluminescence analysis, a thermogravimetric analysis, and an ion chromatography analysis with respect to the prepared quantum dots are performed and the results are shown in Table 1. The prepared quantum dots are dispersed in toluene and examined using DLS, which indicates serious or substantial aggregation. The DLS analysis results are respectively shown in FIGS. 8 and 9 with an average size: 50 nm, σ39 (nm); and an average size: 376 nm, σ317 (nm), respectively.

TABLE 1

| | Samples | QY [%] | Peak [nm] | Cl [a] | OA wt % |
|---|---|---|---|---|---|
| OA | Comp. Example 1 | 62 | 453 | — | 10.2 |
| Cl ×1 | Example 1 | 82 | 454 | 8.3 | 7.0 |
| Cl ×2 | Example 2 | 83 | 455 | 11.4 | 5.7 |
| Cl ×5 | Example 3 | 80 | 455 | 19.0 | 5.1 |
| Cl ×10 | Comp. Example 2 | 80 | 454 | 36.5 | 4.6 |
| Cl ×20 | Comp. Example 3 | 73 | 455 | 40.6 | 4.2 |

[a] units of microgram per milligram of quantum dot

Referring to Table 1, the quantum dots according to Examples exhibit greatly improved luminescence properties and have a reduced amount of an organic material compared with the quantum dots according to Comparative Example 1. Through a solvent dispersion experiment, the quantum dots of Comparative Examples 2 and 3 have a high Cl amount and are substantially aggregated in an organic solvent.

Manufacture of Electroluminescent Devices

Comparative Example 4

A device of ITO/PEDOT:PSS (30 nm)/TFB (25 nm)/QD emission layer (20 nm)/ZnMgO(20 nm)/Al 100 (nm) is manufactured in the following method.

ITO (an anode) is deposited on a substrate, and a PEDOT:PSS layer and a TFB layer as a hole injection layer (HIL) and a hole transport layer (HTL) are respectively formed thereon in a wet coating method. Octane dispersion of the quantum dots according to Comparative Example 1 is spin-coated on the HTL layer to form an emission layer.

A solution of the ZnMgO nanoparticles according to Reference Example 2 (a solvent:ethanol) is prepared. The prepared solution is spin-coated on the emission layer and heat-treated at 80° C. for 30 minutes to form an electron auxiliary layer. On the electron auxiliary layer, an Al electrode (a cathode) is deposited. Electroluminescence properties of the manufactured device are measured and provided in Table 2.

Example 4

An electroluminescent device is manufactured according to the same method as Comparative Example 4 except the quantum dots obtained in Example 1 are used. Electroluminescence properties of the manufactured device are measured and provided in Table 2.

TABLE 2

| Description | EQE (%) | Max. Lum. (cd/m$^2$) | T95 (hr) | T50 (hr) |
|---|---|---|---|---|
| Comparative Example 4 | 8.9 | 14550 | 0.63 | 12.4 |
| Example 4 | 10.7 | 24240 | 10.63 | 51.8 |

T95 indicates time (in hours) taken to reach relative luminance 95% relative to initial luminance. T50 indicates time (in hours) taken to reach relative luminance 50% relative to initial luminance. Referring to the result of Table 2, the device of Example 4 exhibits greatly improved luminance and life-span compared to the device of Comparative Example 4.

Experimental Example 1: Measurement of HOMO Level

Figure 5:
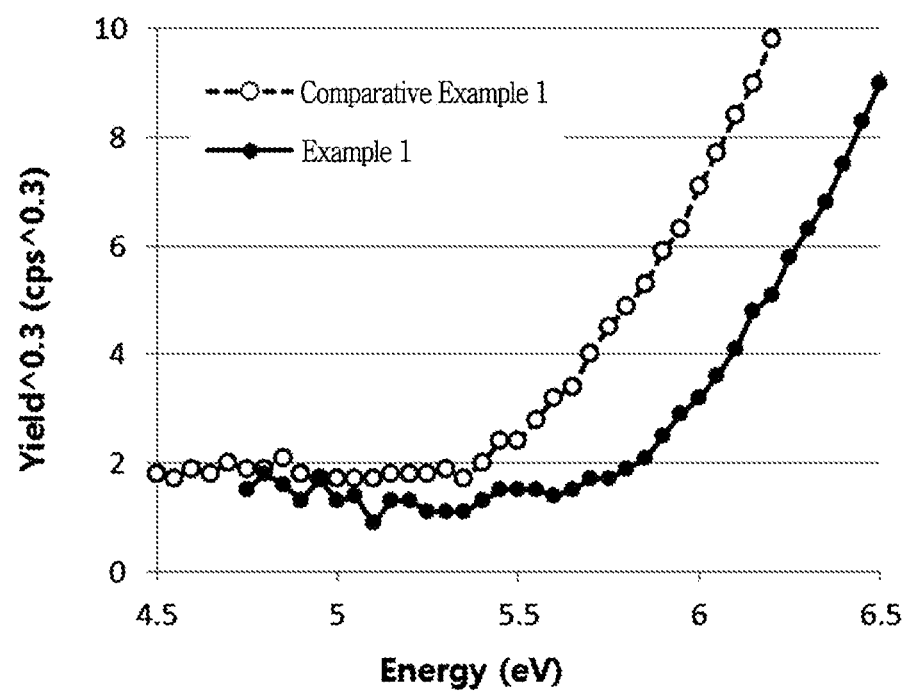
FIG. 5 shows the result of HOMO level measurement of the quantum dots of Comparative Example 1 and Example 1.

A HOMO level is measured in an AC3 method. The results are shown in FIG. 5. Referring to FIG. 5, the quantum dots of Example 1 exhibit an increased HOMO level compared to the quantum dots of Comparative Example 1.

Experimental Example 2: Measurement of Hole Mobility

Figure 6:
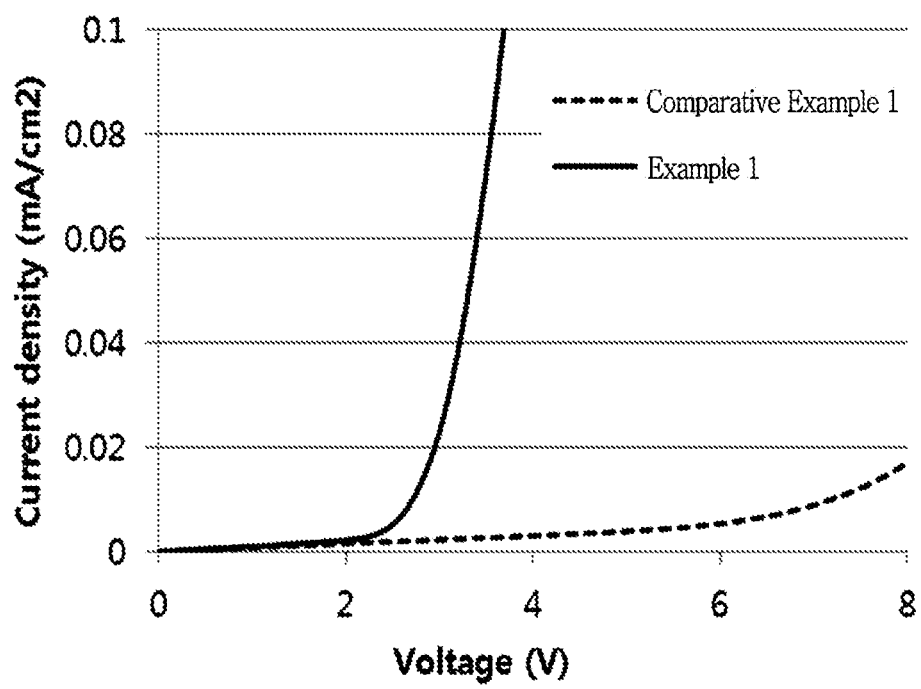
FIG. 6 shows the result of measurement of the HOD properties (hole mobility) of the quantum dots of Comparative Example 1 and Example 1.

Each HOD is manufactured with respect to the quantum dots of Comparative Example 1 and the quantum dots of Example 1. As a voltage is applied to the manufactured HOD, the current density of the HOD is measured, and the results are shown in FIG. 6. Referring to the results of FIG. 6, the quantum dots of Example 1 exhibit an increase in hole mobility compared to the quantum dots of Comparative Example 1.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A light emitting device comprising
   a first electrode and a second electrode facing each other, and
   an emission layer disposed between the first electrode and the second electrode,
   wherein the emission layer comprises quantum dots, wherein a surface of the quantum dots includes an organic ligand and a halogen, and
   wherein an amount of the halogen is greater than or equal to about 1 microgram per milligram of the quantum dots and less than about 30 micrograms per milligram of the quantum dots.

2. The light emitting device of claim 1, wherein an amount of the organic ligand is less than or equal to about 10 weight percent based on a total weight of the quantum dots.

3. The light emitting device of claim 1, wherein the halogen comprises Cl.

4. The light emitting device of claim 1, wherein the halogen is bounded to a surface of the quantum dots.

5. The light emitting device of claim 4, wherein the halogen bound to the quantum dots results from a surface exchange reaction with a metal halide.

6. The light emitting device of claim 5, wherein the metal halide comprises a zinc chloride.

7. The light emitting device of claim 1, wherein the amount of the halogen is greater than or equal to about 1.5 microgram per milligram of the quantum dots and less than about 25 micrograms per milligram of the quantum dots.

8. The light emitting device of claim 1, wherein a mole ratio of the halogen relative to the organic ligand is greater than or equal to 0.5:1 and less than about 2.2:1.

9. The light emitting device of claim 1, wherein
the quantum dots comprise a core comprising a first semiconductor nanocrystal and a shell disposed on the core, the shell comprising a second semiconductor nanocrystal having a different composition from the first semiconductor nanocrystal,
the first semiconductor nanocrystal and the second semiconductor nanocrystal independently comprise a Group II-VI compound, a Group III-V compound, or a combination thereof, and
optionally, wherein the quantum dots do not comprise cadmium, lead, or a combination thereof.

10. The light emitting device of claim 1, wherein the quantum dots comprise a metal comprising indium, zinc, or a combination thereof, and a non-metal comprising phosphorus, selenium, tellurium, sulfur, or a combination thereof, and
optionally, wherein the quantum dots do not comprise cadmium, lead, or a combination thereof.

11. The light emitting device of claim 1, wherein the organic ligand comprises RCOOH, $RNH_2$, $R_2NH$, $R_3N$, $R_3PO$, $R_3P$, ROH, RCOOR, $RPO(OH)_2$, RHPOOH, $R_2POOH$, or a combination thereof, wherein, each R is independently a substituted or unsubstituted C3 to C40 aliphatic hydrocarbon group, a substituted or unsubstituted C6 to C40 aromatic hydrocarbon group, or a combination thereof.

12. The light emitting device of claim 1, wherein the organic ligand comprises a C6 to C40 aliphatic carboxylic acid compound.

13. The light emitting device of claim 1, wherein the light emitting device emits blue light and wherein the quantum dots exhibit a maximum photoluminescence peak in a wavelength range of greater than or equal to about 440 nanometers and less than or equal to about 465 nanometers,
and optionally, wherein the light emitting device exhibits a maximum luminance of greater than or equal to about 10,000 candela per square meter and a T50 of greater than or equal to about 20 hours.

14. The light emitting device of claim 1, wherein the light emitting device comprises an electron auxiliary layer disposed between the emission layer and the second electrode, and the electron auxiliary layer comprises a nanoparticle comprising a zinc metal oxide represented by Chemical Formula 1:

$$Zn_{1-x}M_xO \qquad \text{Chemical Formula 1}$$

wherein, in Chemical Formula 1,
M is Mg, Ca, Zr, W, Li, Ti, Y, Al, or a combination thereof, and $0 \leq x \leq 0.5$.

15. A light emitting device comprising a first electrode and a second electrode facing each other, and an emission layer disposed between the first electrode and the second electrode,
wherein the emission layer comprises quantum dots,
wherein a surface of the quantum dots includes an organic ligand and a halogen,
wherein the quantum dots do not comprise a thiol containing organic compound bound to a surface of the quantum dots, and
wherein a mole ratio of the halogen relative to the organic ligand is greater than or equal to about 0.5:1 and less than about 2.2:1.

16. The light emitting device of claim 15, wherein an amount of the halogen is greater than or equal to about 1 microgram per milligram of the quantum dots and less than about 30 micrograms per milligram of the quantum dots.

17. The light emitting device of claim 15, wherein the halogen is bounded to a surface of the quantum dots by a surface exchange reaction with a metal halide.

18. The light emitting device of claim 15, wherein the quantum dots comprise a metal comprising indium, zinc, or a combination thereof, and a non-metal comprising phosphorus, selenium, tellurium, sulfur, or a combination thereof, and
optionally, wherein the quantum dots do not comprise cadmium, lead, or a combination thereof.

19. The light emitting device of claim 15, wherein the light emitting device emits blue light and the quantum dots are configured to show a quantum efficiency of greater than or equal to about 80%.

* * * * *